(12) United States Patent
Liu et al.

(10) Patent No.: US 6,429,536 B1
(45) Date of Patent: Aug. 6, 2002

(54) SEMICONDUCTOR DEVICE

(75) Inventors: Sheng-Tsung Liu, Kaohsiung (TW); Francisco C. Cruz, Jr., Laguna (PH)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/614,683

(22) Filed: Jul. 12, 2000

(51) Int. Cl.[7] .................. H01L 23/48; H01L 23/52; H01L 29/40
(52) U.S. Cl. .................. 257/786; 257/784; 257/782; 257/773; 257/780
(58) Field of Search ................ 257/784, 786, 257/782, 780, 779, 776, 773

(56) References Cited

U.S. PATENT DOCUMENTS

| | | | |
|---|---|---|---|
| 3,935,501 A | * 1/1976 | Sterbal | 313/499 |
| 4,975,761 A | * 12/1990 | Chu | 257/686 |
| 5,498,901 A | * 3/1996 | Chillara et al. | 257/666 |
| 5,811,880 A | 9/1998 | Banerjee et al. | |
| 5,825,628 A | 10/1998 | Garbelli et al. | |
| 5,883,428 A | 3/1999 | Kabumoto et al. | |
| 5,903,050 A | * 5/1999 | Thurairajaratnam et al. | 257/695 |
| 6,161,753 A | * 12/2000 | Tsai et al. | 228/180.5 |
| 6,222,274 B1 | * 4/2001 | Nishiura et al. | 257/776 |

FOREIGN PATENT DOCUMENTS

JP    04162801 A  * 6/1992

* cited by examiner

Primary Examiner—Jerome Jackson, Jr.
Assistant Examiner—Chris C. Chu

(57) ABSTRACT

A semiconductor device mainly comprises a chip disposed on the upper surface of a substrate. The upper surface of the substrate is provided with a ground ring, a power ring, and a plurality of conductive traces arranged at the periphery of the ground ring and the power ring. The semiconductor device comprises at least a surface-mountable device connected across the ground ring and the power ring. The semiconductor device of the present invention is characterized by having at least a bonding wire formed across the surface-mountable device. The bonding wire is connected between one of the bonding pads of the chip and the power ring wherein at least one downward depression is formed in a lengthen portion at a top of the bonding wire.

1 Claim, 3 Drawing Sheets

SEMICONDUCTOR DEVICE

Background of the Invention

1. Field of the Invention

This invention generally relates to a semiconductor device, and more particularly to an electronic package using wire bonding technique wherein the electronic package comprises a chip disposed on a substrate having a ground ring, a power ring, and at least a surface-mountable device connected across the ground ring and the power ring.

2. Description of the Related Art

A semiconductor device typically includes a circuitized substrate with one or more active devices attached thereon; packages including only one device are known as Single Chip Modules (SCM), while packages including a plurality of devices are called Multi Chip Modules (MCM). The active device is typically a chip commonly made of Silicon, Germanium or Gallium Arsenide.

As the speed of semiconductor devices increase, noise in the DC power and ground lines increasingly becomes a problem. To reduce this noise, capacitors known as decoupling capacitors are often used to reduce power supply noise which occurs due to change in potential difference between the ground voltage and the power-supply voltage supplied to the active device. The decoupling capacitors are placed as close to the active device as practical to increase their effectiveness. Typically the decoupling capacitors are connected to power and ground as close as possible to the active device.

FIG. 1 shows a conventional BGA substrate 100 with a chip 110 securely attached t the metal paddle 102 on the upper surface of the substrate 100. The upper surface of the substrate 100 is provided with a ground ring 104, a power ring 106, and a plurality of conductive traces 108. The ground ring 104 is predetermined for coupling to a source of the ground reference voltage. The power ring 106 is predetermined for coupling to a source of the power reference voltage potential. In order to suppress the power supply noise described above, several decoupling capacitors 120 are connected across the ground ring 104 and the power ring 106. Typically, the decoupling capacitors 120 are surface-mountable devices (SMD's) used in the so-called surface-mounting technique in which the capacitors 120 are directly secured to the ground ring 104 and the power ring 106 via two end contacts thereof (see FIG. 2).

However, when these capacitors are on the substrate at the package level, they hinder the space available for the wire bonding. This is because it is generally preferred to avoid contact between the bonding wires and the capacitors thereby preventing short circuits from occurring. Therefore, the bonding wires 130 connected between the chip 110 and the ground ring 104 (or the power ring 106) at the periphery of the decoupling capacitors 120 must keep away from the decoupling capacitors 120 thereby increasing difficulties and risks of wire bonding.

SUMMARY OF THE INVENTION

It is a primary object of the present invention to provide a semiconductor device comprising a chip disposed on a substrate having a ground ring, a power ring, and at least a surface-mountable device connected across the ground ring and the power ring, wherein the semiconductor device is characterized by having at least a bonding wire formed across the surface-mountable device and electrically connected to the chip and the power ring wherein at least one downward depression is formed in a lengthen portion at a top of the bonding wire for obtaining a stable wire loop shape with a high shape-retaining strength thereby preventing the bonding wire from contacting the surface-mountable device and causing a short circuit.

It is another object of the present invention to provide a semiconductor device characterized in that the surface-mountable device has at least a bonding section formed between the two end contacts thereof for bonding to two separate bonding wires that extends from the bonding section to the chip and the power ring, respectively, thereby preventing the bonding wires from contacting the surface-mountable device and causing a short circuit.

It is still another object of the present invention to provide a semiconductor device characterized in that the power ring has a protrusion portion extending away from the chip, and the protrusion portion is located corresponding to the surface-mountable device for bonding to the bonding wire connecting between the chip and the power ring thereby allowing a larger processing window during wire bonding, thereby enhancing the reliability of the bonding wire.

The semiconductor device of the present invention mainly comprises a chip disposed on the upper surface of a substrate. The upper surface of the substrate is provided with a ground ring, a power ring, and a plurality of conductive traces arranged at the periphery of the ground ring and the power ring. The semiconductor device comprises at least a surface-mountable device (such as a decoupling capacitor) connected across the ground ring and the power ring.

The semiconductor device according to a first preferred embodiment of the present invention is characterized by having at least a bonding wire formed across the surface-mountable device. The bonding wire has one end connected to one of the bonding pads of the chip and the other end connected to the power ring wherein at least one downward depression is formed in a lengthen portion at a top of the bonding wire.

The semiconductor device according to a first preferred embodiment of the present invention is characterized in that the surface-mountable device is provided with at least a bonding section formed on the surface-mountable device between the two end contacts thereof. Therefore, the chip can be electrically connected to the power ring through two separate bonding wires. The two bonding wires includes a first bonding wire having one end connected to one of the bonding pads of the chip and the other end connected to the bonding section on the surface-mountable device, and a second boning wire having one end connected to the bonding section on the surface-mountable device and the other end connected to the power ring.

According to the semiconductor device of the present invention, since the bonding wires predetermined to be connected between the chip and the ground ring (or the power ring) at the periphery of the surface-mountable device do not need to be kept away from the surface-mountable device, difficulties and risks of wire bonding for the semiconductor device are significantly reduced.

Further, the power ring of the semiconductor device in accordance with the present invention preferably has a protrusion portion extending away from the chip. The protrusion portion is located corresponding to the surface-mountable device for bonding to a bonding wire connecting between the chip and the power ring thereby allowing a larger processing window during wire bonding, thereby enhancing the reliability of the bonding wire.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
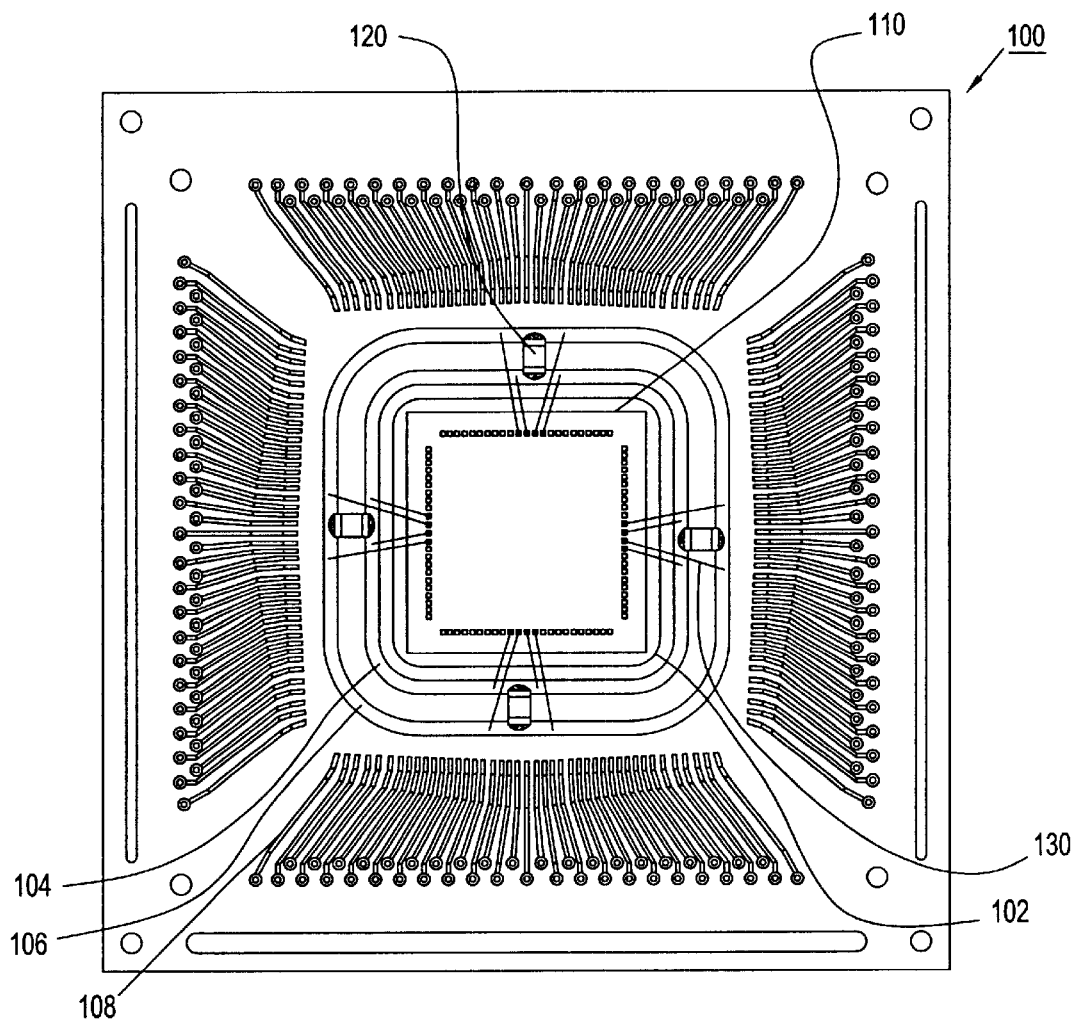
FIG. 1 is a top plan view of a conventional semiconductor device illustrating several decoupling capacitors connected across ground ring and power ring of a substrate wherein the package body has been removed.
Figure 2:
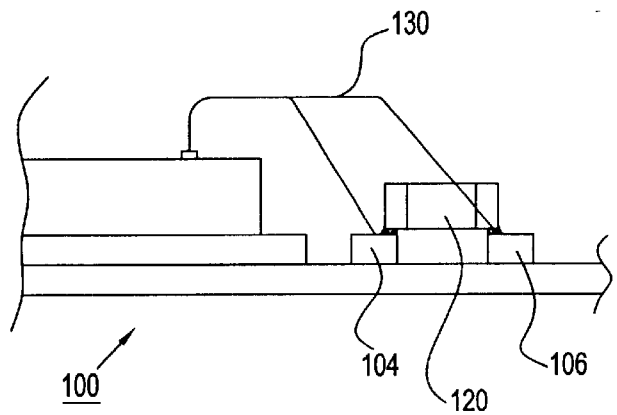
FIG. 2 is a cross sectional view of a portion of the conventional semiconductor device of FIG. 1 wherein the package body has been removed.
Figure 3:
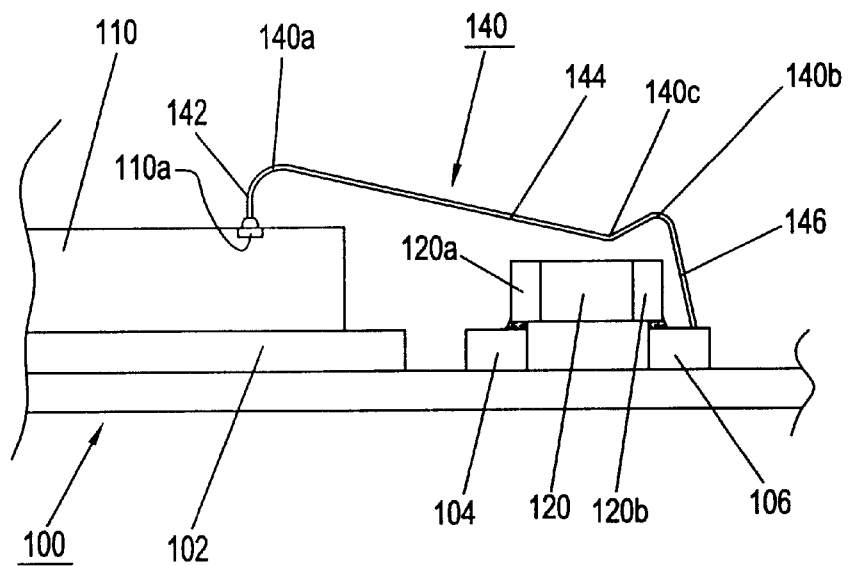
FIG. 3 is a cross sectional view of a portion of a semiconductor device according to a first preferred embodiment of the present invention wherein the package body has been removed.

FIG. 3 shows a semiconductor device according to a first preferred embodiment of the present invention. The semiconductor device mainly comprises a substrate 100 and a chip 110 securely attached to a metal paddle 102 disposed on the upper surface of the substrate 100. The upper surface of the substrate 100 is provided with a ground ring 104, a power ring 106, and a plurality of conductive traces (not shown in FIG. 3). The ground ring 104 is predetermined for coupling to a source of the ground reference voltage such as a ground plane (not shown) formed in the substrate 100. The power ring 106 is predetermined for coupling to a source of the power reference voltage such as a power plane (not shown) formed in the substrate 100. Therefore, the source voltage and ground potential can be supplied in any desired positions through the ground plane and the power plane, so it is possible to shorten the source voltage or ground potential feed lines to suppress power source noises and attain speedup of the operation of the chip.

The semiconductor device of the present invention comprises at least a surface-mountable device connected across the ground ring 104 and the power ring 106. The surface-mountable device can be a decoupling capacitors 120 in order to further suppress the power supply noise. The capacitor 120 is directly secured to the round ring 104 and the power ring 106 via the end contacts 120a, 120b, respectively, using so-called surface-mounting technique.

Referring to FIG. 3, the semiconductor device according to the first preferred embodiment of the present invention is characterized by having a bonding wire 140 formed across a surface-mountable device such as the decoupling capacitor 120. The bonding wire 140 is connected between the bonding pad 110a of the chip 110 and the power ring 106. The bonding wire 140 includes a neck height portion 142, a lengthen portion 144 and an inclined portion 146 along with two kinks 140a and 140b formed at both ends of the lengthen portion 144, thus in this regard being similar to a conventional bonding wire with a trapezoidal loop shape. In the present invention, however, a third or intermediate kink 140c is further formed in the lengthen portion 144 so that the shape of the lengthen portion 144 is formed into a shape which is depressed downward or toward the substrate 100. In other words, the lengthen portion 144 of the wire 140 is bent at an intermediate portion thereof toward the decoupling capacitor 120 disposed on the substrate 100. Since the kink 140c is formed in the lengthen portion 144 of the wire loop so that the lengthen portion 144 has a depressed or downwardly bent shape, the position where the kink 144c is located is stabilized because of the presence of the kink 144c, and a wire loop having a high shape-retaining strength is obtained. Therefore, it is not easy for external forces such as mold flow pressure during molding to bend the bonding wire 140 into contact with the decoupling capacitor 120.

Figure 4:
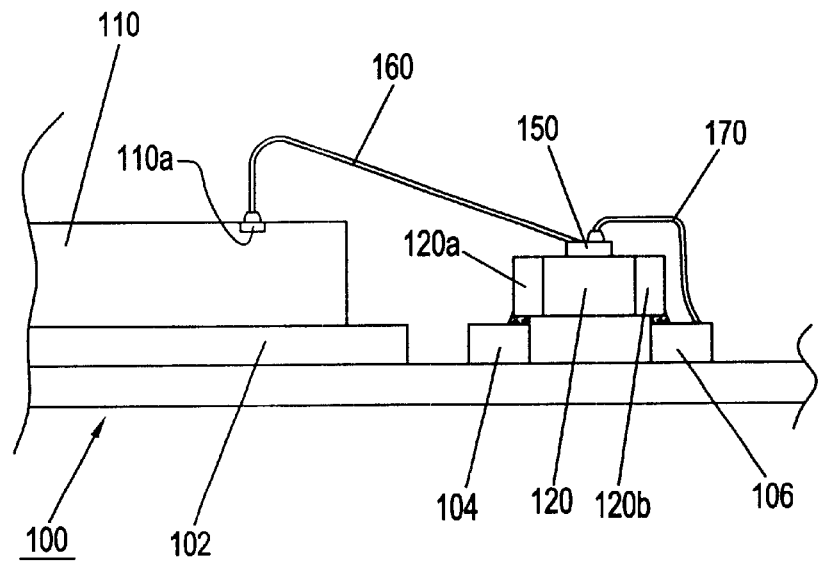
FIG. 4 is a cross sectional view of a portion of a semiconductor device according to a second preferred embodiment of the present invention wherein the package body has been removed.

FIG. 4 shows a semiconductor device according to a second preferred embodiment of the present invention. The semiconductor device is characterized in that decoupling capacitor 120 is provided with at least a bonding section 150 formed between the two end contacts 120a, 120b thereof. The bonding section 150 preferably comprises a dielectric material formed on the surface of the decoupling capacitor 120 and a bonding region formed on the dielectric material. The bonding region on the dielectric material is preferably formed from gold or palladium, which bonds well with conventional bonding wire material. The bonding wire 160 is connected between the bonding pad 110a of the chip 110 and the bonding region on the dielectric material of the bonding section 150. The bonding wire 170 is connected between the bonding region on the dielectric material and the power ring 106. Therefore, the chip 110 can be electrically connected to the power ring 106 through two separate bonding wires 160, 170. Since the wire span of the bonding wires 160, 170 is quite short thereby reducing the wire sweep problem during molding.

Figure 5:
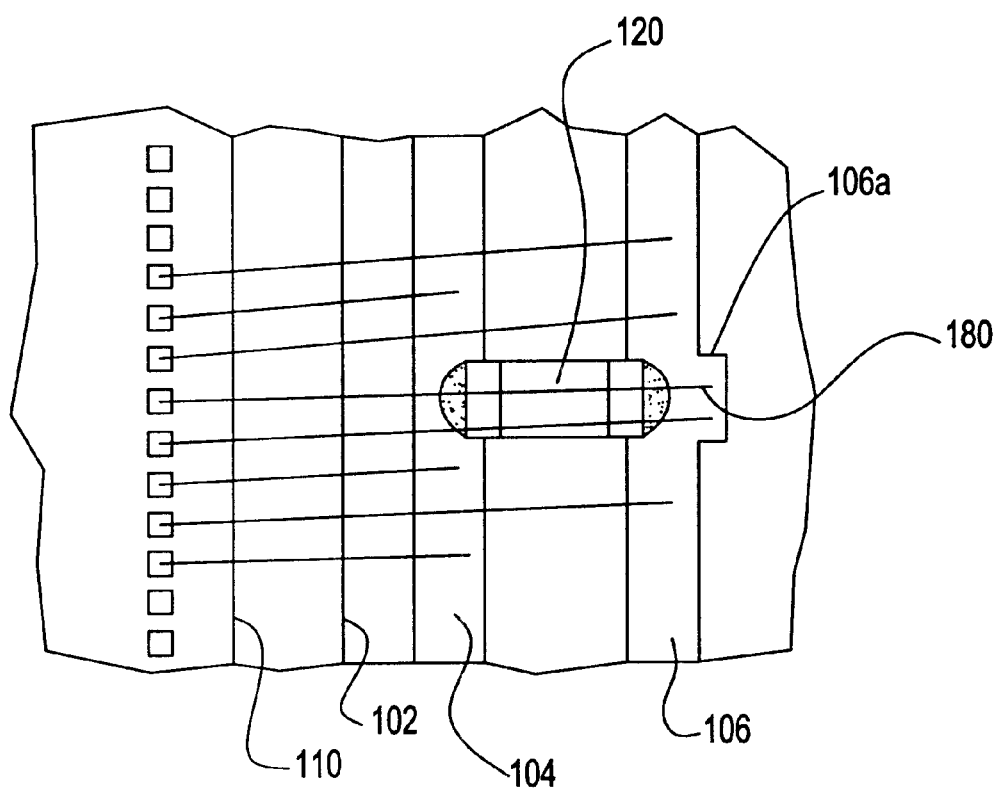
FIG. 5 is a top plan view of a portion of another semiconductor device in accordance with the present invention wherein the package body has been removed.

Referring to FIG. 5, the power ring 106 of the semiconductor device in accordance with the present invention preferably has a protrusion portion 106a extending away from the chip 110. The protrusion portion 106a is located corresponding to the decoupling capacitor 120 for bonding to bonding wires 180 connecting between the chip 110 and the power ring 106 and formed across the decoupling capacitor 120. Since the protrusion portion 106a of the power ring 106 extends away from the chip 110, it allows a larger processing window during wire bonding operation of the bonding wires 180, thereby enhancing the reliability of the bonding wires 180.

It should be understood that the semiconductor device of the present invention further comprises a plurality of other bonding wires electrically connecting the bonding pads of the chip to the power ring 104, the ground ring 106 and corresponding conductive traces 108 of the substrate 100, respectively. The lower surface of the substrate 100 may be provided with a plurality of solder pads (not shown) electrically connected to the power ring 104, the ground ring 106 and corresponding conductive traces 108, respectively. Typically, each solder pad has a solder ball mounted thereon for making external electrical connection. The chip 110 and all bonding wires are encapsulated against a portion of the upper surface of the substrate 100.

According to the semiconductor device of the present invention, the bonding wires predetermined to be connected between the chip and the ground ring (or the power ring) at the periphery of the surface-mountable device do not need to be kept away from the surface-mountable device. Therefore, in the semiconductor device of the present invention, the surface-mountable device does not hinder the space available for the wire bonding thereby significantly reducing difficulties and risks of wire bonding for the semiconductor device.

Although the invention has been explained in relation to its preferred embodiment, it is to be understood that many other possible modifications and variations can be made without departing from the spirit and scope of the invention as hereinafter claimed.

What is claimed is:

1. A semiconductor device comprising:

a substrate having opposing upper and lower surfaces, the upper surface of the substrate being provided with a ground ring, a power ring, and a plurality of conductive traces arranged at the periphery of the ground ring and the power ring;

at least a surface-mountable device connected across the ground ring and the power ring, the surface-mountable device comprising two end contacts and at least a bonding section formed on the surface-mountable device between the two end contacts;

a chip disposed on the upper surface of the substrate, the chip having a plurality of bonding pads located about the periphery thereof;

at least a first bonding wire having one end connected to one of the bonding pads of the chip and the other end connected to the bonding section on the surface-mountable device; and at least a second bonding wire having one end connected to the bonding section on the surface-mountable device and the other end connected to the power ring;

wherein the bonding section comprises a dielectric material formed on the surface-mountable device and a bonding region formed on the dielectric material.

* * * * *